United States Patent [19]
Park et al.

[11] Patent Number: 5,407,848
[45] Date of Patent: Apr. 18, 1995

[54] METHOD FOR FORMING A GATE ELECTRODE HAVING A POLYCIDE STRUCTURE

[75] Inventors: Sang Hoon Park, Kyungki; Ho Gi Jeong, Kyungsangbuk, both of Rep. of Korea

[73] Assignee: Hyundai Electronics Industries Co., Ltd., Rep. of Korea

[21] Appl. No.: 242,474

[22] Filed: May 13, 1994

[30] Foreign Application Priority Data

May 13, 1993 [KR] Rep. of Korea ............ 93-8192

[51] Int. Cl.⁶ .................................... H01L 21/336
[52] U.S. Cl. .................................... 437/44; 437/29; 437/35; 437/41; 437/200
[58] Field of Search .............. 437/41, 44, 193, 200, 437/35, 29; 257/336, 413

[56] References Cited

U.S. PATENT DOCUMENTS

| 5,089,432 | 2/1992 | Yoo et al. | 437/40 |
| 5,147,814 | 9/1992 | Takeuchi | 437/44 |
| 5,262,337 | 11/1993 | Kim | 437/35 |

FOREIGN PATENT DOCUMENTS

| 3-76126 | 4/1991 | Japan | 437/44 |

*Primary Examiner*—T. N. Quach
*Attorney, Agent, or Firm*—Pennie & Edmonds

[57] ABSTRACT

A method for forming a gate electrode is disclosed. A first thermal oxide film is formed on a silicon substrate. A portion of the first thermal oxide film and the substrate is removed by the photolithography method. An impurity is implanted on the substrate after a second thermal oxide film is formed on the entire surface of the resulting structure. The first thermal oxide film and the second oxide film is removed and then a gate oxide film is formed on the entire surface of the resulting structure. A doped polysilicon film and a silicide film is formed on the gate oxide film and then a desired gate electrode is formed by the photolithography method. A third thermal oxide film is formed on the surface of the resulting structure and then second impurity regions are formed on the substrate.

8 Claims, 2 Drawing Sheets

METHOD FOR FORMING A GATE ELECTRODE HAVING A POLYCIDE STRUCTURE

FIELD OF THE INVENTION

This invention relates to a method for forming a gate electrode having a polycide structure. In particular, it relates to a method to increase the effective channel length of a gate electrode thereby improving the electric characteristics of a semiconductor device.

INFORMATION DISCLOSURE STATEMENT

A conventional method for forming a gate electrode having a polycide structure shown in FIG. 1 is as follows:

A gate oxide film 2, a polysilicon film 3 and a silicide film 4 is sequentially formed on a silicon substrate 1. A photo mask(not shown) is arranged on the silicide film 4 and then the photo mask is patterned with a desired width by the photolithography method. The gate oxide film 2 exposed by the photolithography method, the polysilicon film 3 and the silicide film 4 are sequentially etched, thereby forming a gate electrode. A thermal oxide film 5 is formed on the entire surface of the gate electrode and then N− type impurity is implanted on the silicon substrate 1. A spacer oxide film 7 is formed on side walls of the gate electrode and then impurity regions 6 are formed on the silicon substrate 1 by implanting the n+ type impurity thereon, thereby completing the gate electrode having a polycide structure.

The gate electrode formed according to the conventional method has a short effective channel length, which has the effect of not only decreasing the threshold voltage and the breakdown voltage of a semiconductor device but also increasing the substrate current. As a result, the above described conventional method has the shortcoming of reducing the electrical characteristics of the semiconductor device.

SUMMARY OF THE INVENTION

Accordingly, the object of the invention is to provide a method for forming a gate electrode with an increased effective channel length by having a polycide structure with an extrusion on a silicon substrate.

Another object of the invention is to provide a method for forming an improved gate electrode having a polycide structure by simply forming the LDD(Lightly Doped Drain) region without formation of the spacer oxide film.

This invention achieves the above objects and other advantages by the following process:

Sequentially forming a first thermal oxide film and a photoresist on a silicon substrate;

Patterning the photoresist to expose a portion of the first thermal oxide film;

Etching the first thermal oxide film thus exposed and a portion of the silicon substrate with a desired depth;

Removing the photoresist on the first thermal oxide film;

Forming a second thermal oxide film on the entire surface of the resulting structure including the first thermal oxide film and the silicon substrate and implanting a low concentration impurity on the silicon substrate, thereby forming first impurity regions;

Removing the first and the second thermal oxide films and forming a gate oxide film on the entire surface of the silicon substrate on which an impurity is implanted;

Sequentially forming a doped polysilicon film and silicide film on the gate oxide film and patterning the doped polysilicon film and silicide film, thereby forming a gate electrode; and Forming a third thermal oxide film on the entire surface of the resulting structure including the gate oxide film, the doped polysilicon film and the silicide film and implanting a high concentration impurity on the silicon substrate, thereby forming second impurity regions.

BRIEF DESCRIPTION OF THE DRAWINGS

The above described purpose and other advantages of the present invention will become more apparent by describing the preferred embodiment of the present invention with reference to the attached drawings, in which.

Similar reference characters refer to similar parts through the several views of the drawings.

DETAILED DESCRIPTION OF THE INVENTION

FIG. 2A through 2E illustrate cross sectional views showing a formation of a gate electrode having a polycide structure on a silicon substrate according to the present invention.

Figure 1:
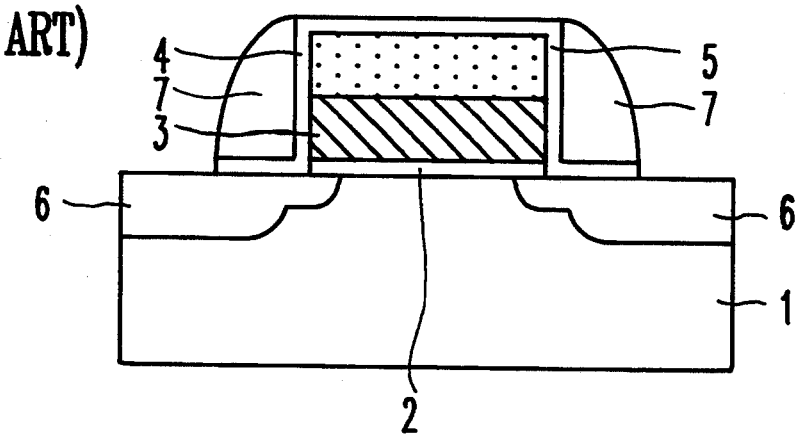
FIG. 1 illustrates a cross sectional view showing a formation of a gate electrode on a silicon substrate according to the conventional method.
Figure 2A:
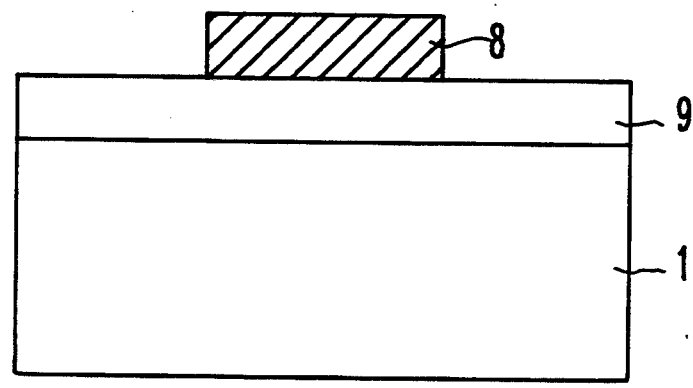
FIG. 2A through 2E illustrate cross sectional views showing a formation of a gate electrode having a polycide structure on a silicon substrate according to the present invention.

FIG. 2A illustrates a first thermal oxide film 9 formed on a silicon substrate 1 with a thickness of 1000 to 5000A. A photo mask 8 which is patterned by the photolithography method is formed on the first thermal oxide film 9.

Figure 2B:
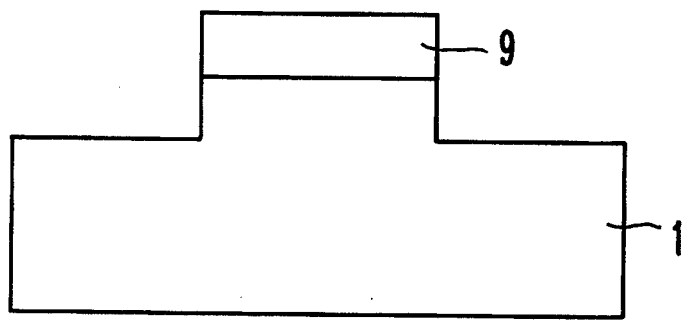

FIG. 2B illustrates a cross sectional view of the structure in which the first thermal oxide film 9 exposed by the photolithography method and a portion of the substrate 1 are sequentially etched with a desired depth, and then the photoresist 8 is removed by the conventional method.

Figure 2C:
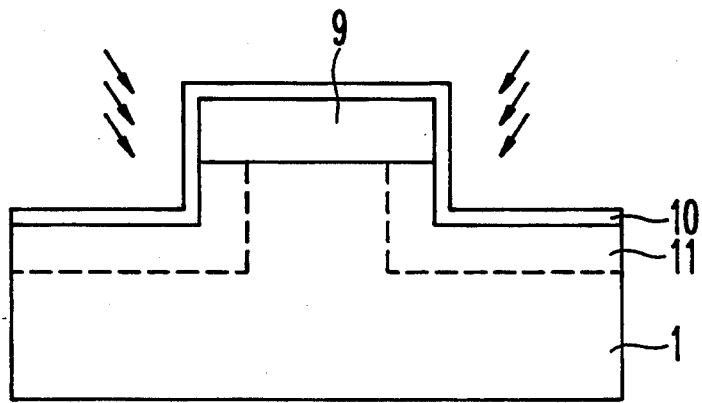

FIG. 2C illustrates a second thermal oxide film 10 formed on the entire surface of the substrate 1 and the first thermal oxide film 9 with a thickness of 100 to 500A. Thereafter, first impurity regions are formed on the substrate 1 by implanting a low concentration impurity.

Figure 2D:
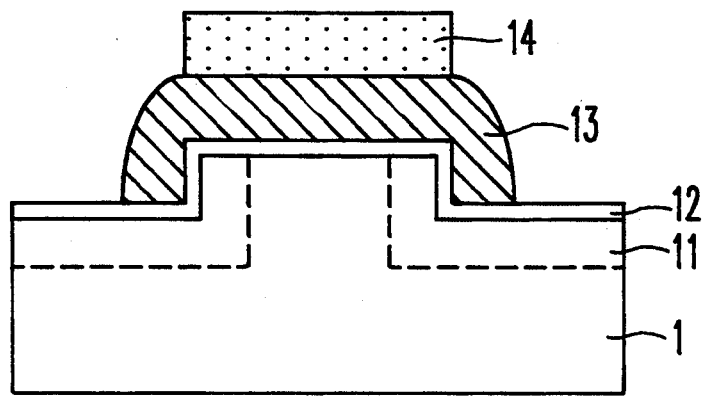

In FIG. 2D, the first thermal oxide film 9 and the second thermal oxide film 10 have been removed by the HF etchant. A gate oxide film 12 is formed on the entire surface of the resulting silicon substrate 1. A doped polysilicon film 13 and a silicide film 14 are sequentially formed on the gate oxide film 12. The doped polysilicon film 13 and the silicide film 14 is patterned by the photolithography method, thereby forming a gate electrode. The polysilicon film 13 is etched so as to have a gradient.

Figure 2E:
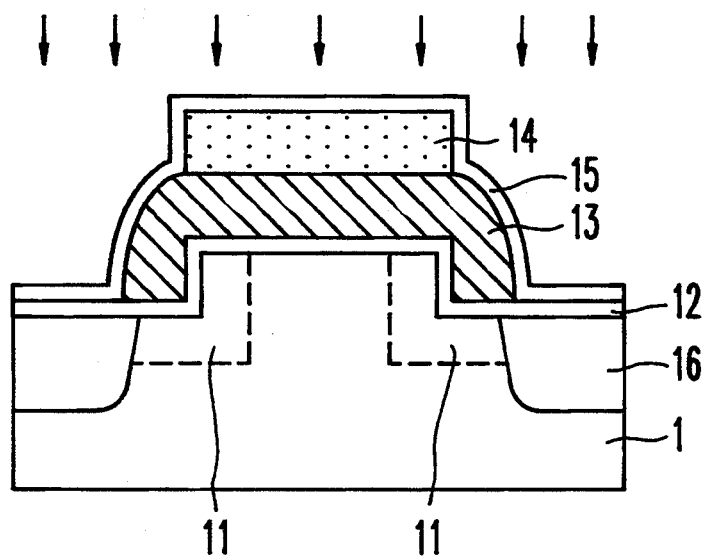

FIG. 2E illustrates a third thermal oxide film or a nitride film 15 sequentially formed on the entire surface of the resulting structure. Then, the second impurity regions 16 are formed on the substrate 1 by implanting a high concentration impurity.

As described above, the gate electrode having a polycide structure according to the present invention increases the effective channel length, thereby not only increasing the threshold voltage and the breakdown voltage but also decreasing the substrate current. As a consequence, the electric characteristics of a semiconductor device is improved. Also the LDD region is simply formed without a formation of a spacer oxide film.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A method for forming a gate electrode having a polycide structure comprises:

sequentially forming a first thermal oxide film and a photoresist on a silicon substrate;

patterning said photoresist to expose a portion of said first thermal oxide film;

etching said first thermal oxide film thus exposed and said silicon substrate with a desired depth;

removing said photoresist on said first thermal oxide film;

forming a second thermal oxide film on the entire surface of the resulting structure including said first thermal oxide film and said silicon substrate and implanting a low concentration impurity on the said silicon substrate, thereby forming first impurity regions;

removing said first thermal oxide film and said second thermal oxide film and forming a gate oxide film on the entire surface of said silicon substrate on which impurity is implanted;

sequentially forming a doped polysilicon film and silicide film on said gate oxide film and patterning said doped polysilicon film and silicide film, thereby forming a gate electrode; and forming a third thermal oxide film formed on the entire surface of the resulting structure including said gate oxide film, said doped polysilicon film and said silicide film and implanting a high concentration impurity on said silicon substrate, thereby forming second impurity regions.

2. The method of claim 1, wherein said first thermal oxide film is formed with a thickness of 1000 to 5000Å.

3. The method of claim 1, wherein said second thermal oxide film and said third oxide film are formed with a thickness of 100 to 500Å, respectively.

4. The method of claim 1, wherein said doped polysilicon film is etched so as to have a gradient.

5. The method of claim 1, wherein a nitride film is formed instead of said third thermal oxide film.

6. The method of claim 1, wherein said photoresist is patterned by a photolithography method.

7. The method of claim 1, wherein said doped polysilicon film and said silicide film are patterned by photolithography method.

8. The method of claim 1, wherein said first thermal oxide film and said second thermal oxide film are removed by an HF etchant.

* * * * *